Figure 1A:
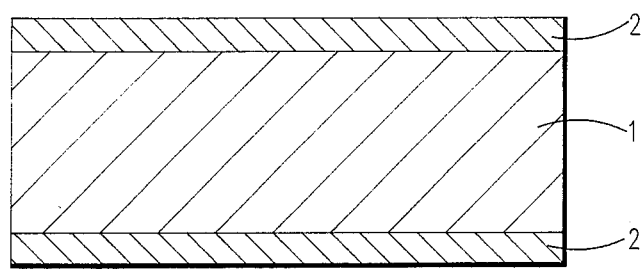
Figure 1B:
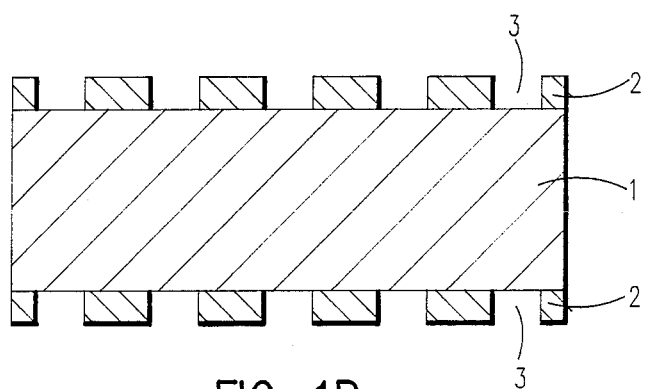
Figure 1C:
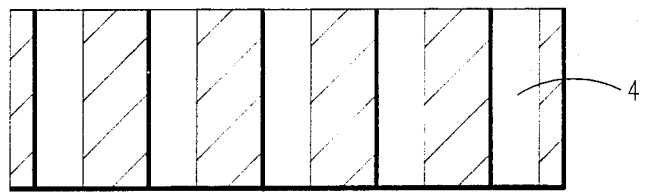

United States Patent [19]

Wittlinger et al.

[11] Patent Number: 4,871,418

[45] Date of Patent: Oct. 3, 1989

[54] PROCESS FOR FABRICATING ARBITRARILY SHAPED THROUGH HOLES IN A COMPONENT

[75] Inventors: Jürgen Wittlinger, Böblingen; Johann Greschner, Pliezhausen; Thomas Bayer; Johann W. Bartha, both of Sindelfingen, all of Fed. Rep. of Germany

[73] Assignee: International Business Machines Corporation, Armonk, N.Y.

[21] Appl. No.: 172,736

[22] Filed: Mar. 23, 1988

[30] Foreign Application Priority Data

Mar. 27, 1987 [EP] European Pat. Off. ........ 87104580.3

[51] Int. Cl.4 ............................................. B29C 37/00
[52] U.S. Cl. .................................. 156/643; 156/628;
156/644; 156/646; 156/659.1; 156/668
[58] Field of Search ............... 156/628, 643, 644, 646,
156/659.1, 661.1, 668, 902

[56] References Cited

U.S. PATENT DOCUMENTS 3,811,999  5/1974  Fleischer et al. ............... 156/643 X
3,852,134 12/1974  Bean ................................... 156/643
4,240,869 12/1980  Diepers ............................. 156/643
4,262,186  4/1981  Provancher ..................... 156/643 X
4,284,468  8/1981  Stearns ............................ 156/661.1

Primary Examiner—Kenneth M. Schor
Assistant Examiner—Andrew J. Anderson
Attorney, Agent, or Firm—Ira David Blecker

[57] ABSTRACT

According to a preferred embodiment, arbitrarily shaped holes are fabricated in 0.1 to 2 mm thick plates of polyoxymethylene homo- or copolymers. For that purpose, the polymeric substrate is photoresist-coated on either side; the desired pattern is simultaneously applied to both the front and the back side of the photoresist layers by imagewise exposure at optimum mask alignment; the photoresist layers are developed and blanket-exposed; the resultant photoresist structures are treated with a cyclic organosilicon compound and postbaked; the through holes are produced by sequential reactive ion etching of the polyoxymethylene from the front and the back side, each time down to a depth of about ⅔ of the substrate thickness; and the silylated photoresist masks are stripped from the front and the back side of the substrate.

19 Claims, 4 Drawing Sheets

PROCESS FOR FABRICATING ARBITRARILY SHAPED THROUGH HOLES IN A COMPONENT

The invention concerns a process for fabricating arbitrarily shaped micromechanical components from plane-parallel plates of polymeric material, and particularly arbitrarily shaped through holes in same. It is used in conjunction with the packaging technology of high-speed computers, in particular for fabricating through holes with diameters of less than about 0.5 mm in relatively thick plates of different materials.

The ever increasing integration on semiconductor chips requires that the signal paths between the individual circuits be kept as short as possible. This can be achieved by accommodating and interconnecting as many chips as possible on a single multilayer chip. The higher packing density on the multilayer ceramic carriers in turn requires a higher density on the so-called second packaging level of the circuit boards. Presently, for example, as many as twenty power and signal planes are arranged on a single circuit board, which renders the board more complex and increases the number of holes to be drilled into the glass fiber reinforced epoxy laminates to over 40,000.

On the multilayer ceramic carriers, which are plugged to the circuit boards, up to 118 semiconductor chips may be accommodated in each case at an edge length of 150 mm and a layer number of 33. During the fabrication of the multilayer ceramic carriers, the through holes in the layers, which are unlaminated at that stage, are formed by mechanical punching. It is desirable that the large number of through holes both in the circuit boards and the individual layers of the multilayer ceramic be etched rather than drilled.

A further application of the invention, which is highly important o packaging technology and which requires the formation of through holes in polymer substrates, is the production of guide plates for fine metal wires used to build electrical test heads. By such test heads, all chip pads on multilayer ceramic carriers can be short-circuit tested in a single test. In this test, the wires, made of resilient material of good conductivity, are forced in the direction of their axes onto the pads of the multilayer ceramic carriers to be tested. Previously, the wires were led through guide plates at a wide spacing, and the through holes for the wires in the guide plates were formed by mechanical drilling. The drilling of the holes with a diameter of about 125 $\mu$m in boards with a thickness of about 0.5 mm was effected by highly time-consuming single hole drilling because of the high precision of the hole positions. Examples of test heads of previous design are described in U.S. Pat. Nos. 3,806,801 and 4,518,910 and in the European Patent Application EP-A 84107154.1 (0 165 331), the disclosures of which are incorporated by reference herein.

As future multilayer ceramic products, owing to their increased packing density, have smaller contact surfaces which additionally may be positioned below the substrate surface and between which additional conductors may be arranged, the existing test heads can no longer be used for testing. The heads required for testing must have much smaller diameters and much smaller spacings of the contact wires. For obtaining the necessary contact pressure and Z-height alignment also with thinner wires, a new wire guide concept had to be realized. Test heads for future multilayer ceramic products will therefore consist of up to 30 guide plates of 1 mm thickness and may include as many as 100 000 holes per head, which means that for building such a test head with 30 guide plates, three million individual holes have to be drilled. This would be highly time-consuming with mechanical drills, apart from the fact that at a hole diameter of about 0.1 mm and a board thickness of 1 mm to be drilled through, mechanical drilling reaches its technical limits.

In addition, future multilayer ceramic products require even smaller guide hole dimensions and not only circular but also elongated holes have to be fabricated. It should also be possible to fabricate arbitrarily shaped holes, for which mechanical drilling is no longer suitable.

In addition to fabricating the through holes in plane-parallel plates, it would be desirable to fabricate micromechanical components from such plates.

Therefore, it is the object of the invention to provide a process for fabricating arbitrarily shaped micromechanical components, and particularly arbitrarily shaped through holes in plane-parallel substrates of polymeric materials.

According to the invention, the inventive object is accomplished by a process for fabricating arbitrarily shaped through holes in a component comprising the steps of:

A. producing a mask by:
  (a) applying a photoresist layer (2) to either side of a substrate (1) of polymeric material;
  (b) simultaneously generating the desired pattern by imagewise exposure on the front and the back side of the photoresist layers (2);
  (c) developing and, if necessary, postbaking the photoresist layers (2);
B. fabricating the through holes by reactive ion etching (RIE) of the polymeric substrate (1), first from the front and then from the back side each time until the desired etch depth has been obtained; and
C. stripping the photoresist masks from the front and the back side of the polymeric substrate (1).

The process of the invention permits structuring polymeric materials of different kinds. It is also suitable for fabricating micromechanical components of any desired shape from polymeric plates or for introducing therein arbitrarily shaped holes. Unexpectedly, it has been found however that through holes with vertical side walls and predetermined positional tolerances can be fabricated particularly well in plates of polyoxymethylene homo- and copolymers with layer thicknesses of about 0.1 to 2 mm, preferably about 0.5 to 2mm. Therefore, the process according to the invention is described in detail below with reference to that embodiment and FIGS. 1 to 5.

Figures 5A, 5B:
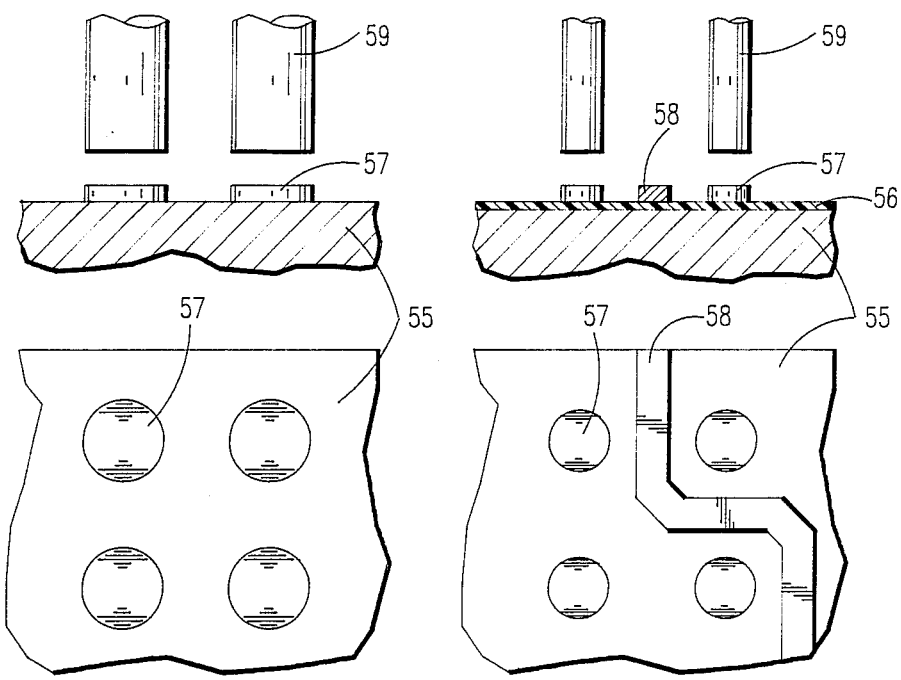
Figure 2:
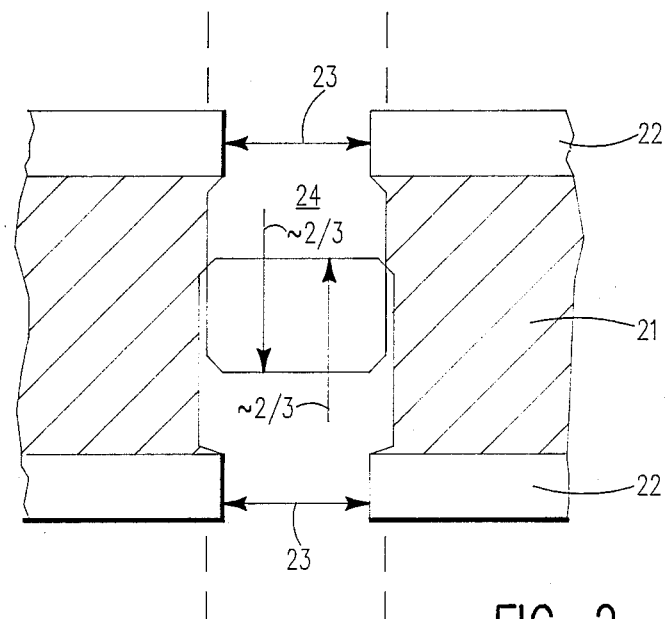

The figures showing in detail:

FIG. 1 (A to C) cross-sectional representations of a process for fabricating guide plates of polyoxymethylene;

FIG. 2 a cross-sectional view, enlarged, of a through hole after reactive ion etching;

FIG. 3 (A and B) SEM (raster electron microscope) representations of holes etched in polyoxymethylene plates;

FIG. 4 (A and B) elongated and circular holes fabricated according to the inventive process;

FIG. 5 (A and B) wires with diameters of 0.13 mm and 0.076 mm for testing existing and future multilayer ceramic products.

Typical applications of reactive ion etching (RIE) in semiconductor processes etch unilaterally down to depths of less than about 6 μm. Thus, it is possible, for example, to produce subcollector insulations in silicon down to depths of 4 to 5 μm, using a process as described in U.S. Pat. No. 4,502,914, the disclosure of which is incorporated by reference herein. Another method, using a three-layer photoresist process in combination with reactive ion etching and yielding trenches as deep as 3 to 4 μm in a silicon semiconductor substrate, is described in U.S. Pat. No. 4,589,952, the disclosure of which is incorporated by reference herein. Similar depths are also etched for thin-film wiring the first packaging plane to form so-called lift-off structures in polyimide. For etching vertical structures through polymer plates with much higher layer thicknesses, i.e., thicknesses of about 0.1 to 2 mm, preferably about 0.5 to 2 mm, a number of important requirements, which are detailed below, have to be met.

1. High etch rate for the substrate of polymer material;
2. low etch rate for the masking material;
3. very good adhesion of the photoresist to the substrate;
4. little underetching of the photoresist mask;
5. plane-parallelism of substrate's front and back side and positional tolerance of entry and exit holes; and
6. complete stripping of photoresist.

The etch rates for several polymers, etched in the typical RIE range at pressures of about 14 μbar, are about 0.1 to 0.2 μm/min. At these etch rates, it would take about 160 hours to etch an about 1 mm thick polymeric plate, which would be highly uneconomical. Surprisingly, it has been found that under the aforementioned RIE conditions polyoxymethylenes (POMs) have an about 10 to 30 times higher etch rate than some of the other known polymers. Polyoxymethylene homomopolymers, formed by polymerization of formaldehyde and end group closure by acetylation, have the following formula:

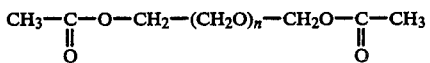

Polyoxymethylene copolymers are obtained by copolymerization of formaldehyde with small quantities of a comonomer, for example with ring ethers or cyclic formals containing at least two adjacent C-atoms. Owing to their thermal stability, their low moisture absorption and their good lubricating properties, both homo- and copolymers are particularly suitable for fabricating guide plates for fine metal wires. Homo- and copolymers of polyoxymethylene are obtainable, for example, under the following trade names: Celcon (copolymer), Celanese Corp.; Delrin (homopolymer), Du Pont de Nemours; Hostaform (copolymer), Hoechst-/Celanese; and Ultraform (copolymer), BASF-/Degussa.

Currently, it is not exactly known what affords the 10 to 30 times higher etch rate of POM. While not wishing to be held to any particular theory, it is believed that the strong temperature dependence of the POM etch rate during RIE substantially accounts for the higher values. Such a dependence obviously does not exist with other polymeric materials. RIE of POM was effected in a temperature range of about 25° to 140° C.

Masks used for the reactive ion etching of POM should have a minimum etch rate in oxygen plasma. Suitable masking materials are therefore inorganic materials, such as silicon oxinitride SiNO. The etch rate of SiNO in oxygen plasma is so low that an etch rate ratio of about 2000:1 is obtained, i.e., a mask of only about 0.5 μm thickness would have been sufficient for etching through a 1 mm thick POM plate. As both materials (SiNO and POM) have thermal coefficients of expansion which differ by more than two powers of ten, and the POM plates are subjected to several heat cycles of up to 100° C. during processing, micro cracks are formed in the SiNO layer, with the SiNO poorly adhering to POM, so that SiNO is not suitable as a masking material.

Therefore, tests were conducted to solve the problems by means of an organic masking material. For this purpose, a positive photoresist was used, such as AZ 1350J by Shipley which consists of a phenolformaldehyde resin and 3,4-di-hydroxybenzophenone -4-[naphthoquinone(1,2)diazide(2)]-sulfonate as reactive constituent. To increase the resistance of the photoresist material in oxygen plasma during RIE, the former is treated with a multifunctional organometallic compound containing or supplying at least two functional groups which are capable of reacting with the corresponding reactive groups of the polymer photoresist. A plurality of compounds meeting these requirements are described in the European Offenlegungsschrift EP-A 0 198 215, the disclosure of which is incorporated by reference herein. Preferred compounds are cyclic organosilicon compounds, in particular hexamethlcyclotrisilazane (HMCTS). HMCTS leads to cross-linkage of the surface of the photoresist material, improving its resistance in oxygen plasma during RIE. After development and postexposure, the photoresist mask is treated with HMCTS in the vapor phase or with an HMCTS solution. Preferred solvents are aromatic hydrocarbons, such as benzene, toluene, xylene, chlorobenzene, and the like. N-methyl-pyrrolidone, γ-butyrolactone, acetates, such as butylacetate, and ethers, such as tetrahydrofuran, are also suitable. Because of the melting temperature of POM of about 165° to 168° C., the postbaking temperature of the silylated photoresist must be lowered to about 90° C. At those temperatures the POM plates will not warp.

The described process leads to an etch rate ratio of POM to the silylated photoresist equal to or greater than about 200:1, i.e., by means of an about 5 μm thick mask of silylated photoresist, an about 1 mm thick plate of polyoxymethylene can be etched through. A further advantage of this process is that an intermediate layer between the photoresist and the POM substrate is eliminated. In lieu of the above-mentioned positive photoresist, whose resistance to an oxygen-containing plasma must be increased by silylation, it is also possible to use a photoresist material which is inherently resistant to RIE in an oxygen-containing plasma. Photoresist materials having these properties form the subject matter of, for example U.S. Pat. No. 4,603,195, the disclosure of which is incorporated by reference herein. The materials described therein are reaction products of polyorganosilicon compounds and quinonediazides (such as a naphthoquinonediazopolysiloxane) and may be used both as positive and negative resist materials. Further polysiloxane based photoresist materials suitable for the inventive process are described in the European Offenlegungsschrift 0 199 940, the disclosure of which is incorporated by reference herein. For using negative photoresist materials in the inventive process, a mask reversal is required, as is well known to those skilled in the art.

The photoresist materials according to U.S. Pat. No. 4,603,195 are developed either by aqueous 10 percent KOH or a 10 percent alcoholic solution of tetramethylammonium hydroxide. If the resist is used as a negative resist, the exposed photoresist layers are postbaked for about 2 minutes at 80° C., and the non-exposed regions of the photoresist layers are subsequently removed by an organic solvent.

It is essential for applying the photoresist that the POM surface be cleaned in a specifically developed step which ensures the necessary adhesion of the photoresist. For cleaning, a diluted sulphuric acid is used in a very narrow process window. A concentration of about 40 percent by volume has proved most favorable, as the improvement of adhesion was insufficient at a lower concentration, whereas a higher concentration led to etching of the POM surface.

Minimum underetching of the photoresist mask ensures that during RIE almost perpendicular structures without any widening over the original mask opening are obtained in the substrate. For applications in semiconductor technology (for example, in the three-layer resist process of U.S. Pat. No. 4,589,952), wherein a several micron-thick photoresist with vertical walls is generally etched, the underetching, i.e., the lateral etching of the structure is of the order of several tenth micron or less. At a structural depth of 2 $\mu$m and 0.1 $\mu$m underetching, for example, the anisotropy factor is 20:1. At the same anisotropy factor, underetching at a structural depth of 1 mm would be about 50 $\mu$m, i.e., the smallest theoretical hole diameter would be about 100 $\mu$m. To etch holes with even smaller diameters at a structural depth of 1 mm, the underetching occurring during the above-mentioned semiconductor applications will have to be reduced further. A typical value for underetching, according to the invention, at a structural depth of 1 mm is, for example, about 10 $\mu$m, which corresponds to an anisotropy factor of 100:1. Underetching can be reduced by suitably adjusting its decisive parameters—pressure and DC self-bias potential.

The assumption that underetching is less at lower pressures was confirmed by testing. The best results with respect to underetching were obtained at a pressure of about 0.8 to 1 $\mu$bar. A reduction of the pressure to values less than 0.8 $\mu$bar was not possible. At very low pressures, a lower etch rate of the substrate to be etched and, as a result of the sputter effect, an increased etch rate for the mask have to be tolerated.

For the inventive process, a pressure range of about 0.8 to 15 $\mu$bar has proven particularly favorable with respect to underetching. The absolute etch rate for this range, as a function of the temperature, is about 1 to 3 $\mu$m per minute, and the etch rate ratio is equal to or greater than about 200:1.

The DC self-bias potential, produced by a capacitively coupled cathode, determines the maximum kinetic energy of the ions impinging upon the substrate, provided that the plasma potential is sufficiently low compared to the self-bias potential and that it is suitable for a given pressure. This self-bias potential is influenced, for example, by the high-frequency amplitude applied, the geometry of the system and the choice of the cathode material. It has been found that a maximum DC self-bias potential is a prerequisite for a good anisotropy factor. Values of about 600 to 900 V, which are preferably used for the inventive process, are obtained by reducing the active cathode surface relative to the anode surface.

According to the invention, the photoresist-coated POM substrates are simultaneously contact-exposed on both sides. A high degree of plane-parallelism of substrate front and back sides is a prerequisite for aligning the masks, used for simultaneous exposure, with an accuracy of about $\pm 1$ to 2 $\mu$m on the substrate.

Bilateral lithography may also lead to a high positional tolerance of entry and exit holes, i.e., these holes are positioned exactly above each other. As a result, the entry and exit holes of the etched structures are also positioned exactly above each other. In a unilateral etch process, a deviation of only 1 degree, referred to the incident ions of the RIE at a plate thickness to be etched of 1 mm, leads to a stagger of about 17 $\mu$m. In a sequential etch process, wherein the substrate is first etched from the front and then from the back side, this stagger is practically halved, with a slight stagger in the hole centers not adversely affecting the plates' future use.

The masks employed for exposing the photoresist layers on the front and the back sides of the substrates are aligned to each other by a mask alignment device MA 25 produced by Suess, which permits an alignment accuracy of about 1 to 2 $\mu$m. After simultaneous exposure and development and if the photoresist process according to EP-A 0 198 215 is used after postexposure and silylation of the photoresist masks, the substrates are sequentially etched, etching from either side for a time corresponding to about $\frac{2}{3}$ of the substrate thickness. The method of bilateral etching with about 10 to 15 percent overetching permits fabricating through holes of good quality. As the geometry of the patterns is defined by photolithography, it is possible to etch not only circular holes but also structures of arbitrary shapes.

The silylated photoresist is partly converted into silicon dioxide during oxygen bombardment. As a result, serious problems occur during the stripping of the silylated photoresist residues. Tests have shown that by means of about 44 percent by weight KOH at about 70° C., the resist residues are stripped in 1 hour without damaging the POM substrate. The photoresist described in U.S. Pat. No. 4,603,195 can also be stripped in that manner.

Example: Plates of polyoxymethylene of 1 mm thickness and 100 mm diameter are used as substrates. Cleaning is effected in a known manner by rinsing with DI water and alcohol. Then, the substrates are treated for about 5 minutes with about 40 percent by volume $H_2SO_4$ to improve the photoresist adhesion. All cleaning steps are effected at room temperature.

A photoresist layer (2) with a layer thickness of about 5 to 6 $\mu$m is spun onto either side of the cleaned substrates (1) (FIG. 1A). As a photoresist, the positive photoresist Shipley AZ 1350 J is used. The photoresist layers (2) are then baked for about 15 minutes at about 80° C. The coated substrates (1) (FIG. 1B) are exposed imagewise on either side, using an exposure device MA 25 by Suess and UV radiation in a wavelength range of 200 to 450 nm, preferably 365 nm. The exposed regions (3) are removed by development with the Shipley AZ developer, an alkaline, sodium borate and sodium hydroxide based developer, which is diluted with DI water at a ratio of 1:4. Blanket post-exposure with UV radiation in a wavelength range of 200 to 450 nm, preferably 365 nm, shortens the subsequent silylation treatment.

For silylating the photoresist layers (2), a bath having the following composition (in percent by volume) is used: 10% hexamethylcyclotrisilazane (HMCTS); 1% N-methylpyrrolidone (NMP); 89% xylene. The samples are left in this bath for about 90 minutes at a bath temperature of about 40° C. After silylation, the samples are rinsed with xylene and baked for about 5 min. at about 90° C.

Reactive ion etching in the bared regions of the mask, which starts on the front and continues on the back side of the substrate, is effected in an oxygen plasma containing, if necessary, up to 50% argon, using a gas flow of 5 to 100 sccm, a pressure ranging from 1 to 50 bar and a DC self-bias potential of about 200 to 900 V until the desired etch depth has been obtained.

In the special embodiment described, the samples are placed in an RIE system (Leybold-Heraeus VZK 550 A) for reactive ion etching (FIG. 1C), observing the following conditions:

| | |
|---|---|
| cathode material: | polycarbonate, Makrolon (trademark of Bayer AG) |
| pressure: | 10 μbar |
| gas flow: | 30 sccm oxygen, 12 sccm argon |
| HF amplitude: | 900 V |
| DC self-bias potential: | 890 V |
| substrate temperature: | 80° C. |
| etch rate: | 1.25 μm/min. |

After reactive ion etching of the through holes (4) (FIG. 1C), the remaining photoresist is stripped in a final step. For this purpose, about 44 percent by weight KOH is used at about 70° C. The time the samples spend in the stripper bath is about 60 minutes. Then, the substrates provided with through holes are rinsed in a known manner with DI water and alcohol.

FIG. 2 is an enlarged representation of the etch process step in a through hole (24) of the Delrin substrate. The silylated photoresist masks (22) on the front and the back side of the substrate (21) comprise mask openings (23). By RIE, the through hole (24) is etched into the Delrin substrate (2) first from the front side and then, after the sample has been turned over, from the back side each time down to a depth of about ⅔ of the substrate thickness. The overlapping of the two etch zones in the center region of the through hole (24) permits producing high-quality through holes. FIG. 2 also shows the underetching of photoresist mask (22). Under the above-mentioned RIE conditions, this underetching is about 10 μm on either side below the mask opening (23).

Figure 3A:
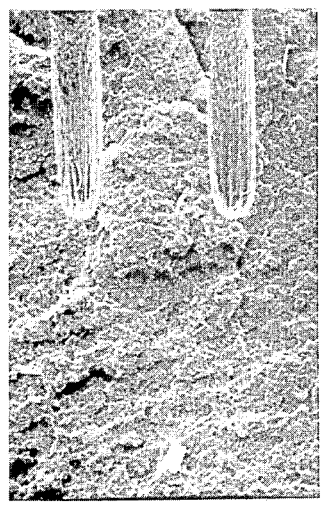
Figure 3B:
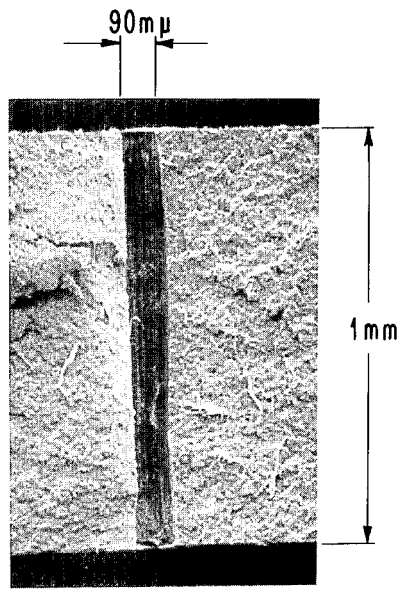

FIGS. 3A and B are SEM photomicrographs of holes etched in Delrin plates. FIG. 3A shows a blind hole in FIG. 3B a through hole with a diameter of 90 μm through a Delrin plate of 1 mm thickness. The hole cross-sections which are highly uniform throughout the full plate thickness were obtained by using the above-described optimum process parameters.

Figure 4A:
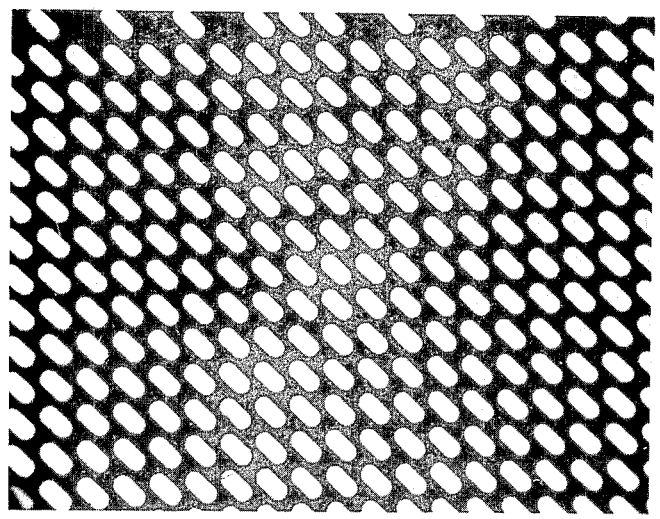
Figure 4B:
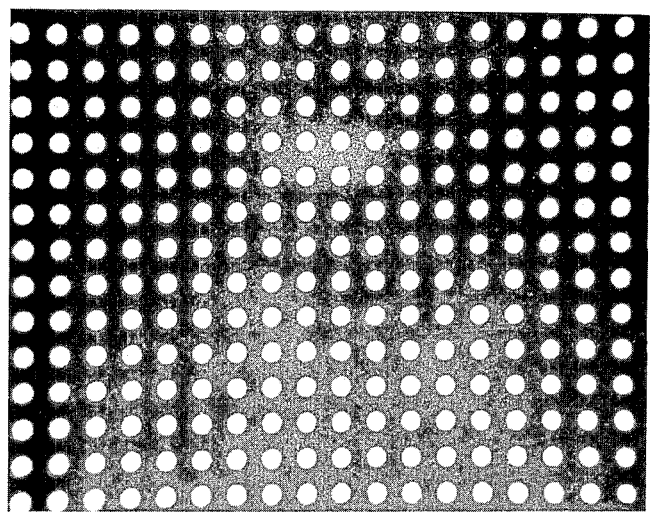

FIGS. 4A and B show light-optical transmission images of through holes, FIG. 4A showing elongated holes measuring about 100 μm along the short axis and FIG. 4B circular holes with a diameter of about 100 μm.

FIG. 5 is a schematic of a process for testing multilayer ceramic substrate wires (59) with diameters of 0.13 mm, which were previously used, and wires with diameters of 0.076 mm, which will be used in future test heads, being shown on the left and the right, respectively. Contact pads (57) are positioned on the left on an aluminum oxide ceramic substrate (55)—in the figure on the right overlying a polymeric layer - (56) on a glass ceramic substrate (55). Between the contact pads, illustrated on the right, additional conductors (58) are provided which were applied by thin-film technology. The plan views below the respective representations show the higher density of contact pads and conductors in future products. In previously used test heads, the wires were generally led at wide spacings through three Delrin guide plates. In the wire guide concept of test heads for future multilayer ceramic substrates, the thinner wires are led through up to 30 guide plates stacked on top of each other. Test heads of this kind are described in the European patent application No. 87104577.9 (Docket No. GE9-86-009), the disclosure of which is incorporated by reference herein.

The inventive process permits providing about 0.1 to 2 mm, preferably about 0.5 to 2 mm, thick polymeric plates of polyoxymethylene with vertical through holes which may be arbitrarily shaped.

The inventive process, which is a combination of photolithography and reactive ion etching, also permits fabricating plastic components measuring less than 100 μm. The described process steps replace mechanical treatment steps, such as drilling, turning, milling, curring, and the like in the fabrication of such components.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. Process for fabricating arbitrarily shaped through holes in a component, comprising the steps of:
   A. producing photoresist mask on the front and back side of a substrate by:
      (a) applying photoresist layers (2) to the front and back side of a substrate (1) of polymeric material, wherein the polymeric material comprises polyoxymethylene (POM) homo- or copolymers;
      (b) simultaneously generating the desired pattern by imagewise exposure on the front and the back side of the photoresist layers (2);
      (c) developing the photoresist layers (2);
   B. fabricating the through holes by reactive ion etching (RIE) of the polymeric substrate (1), first from the front and then from the back side, each time until a predetermined etch depth has been obtained;
   C. stripping the photoresist masks from the front and the back side of polymeric substrate (1)

2. Process according to claim 1 wherein the step of generating the desired pattern is accomplished by providing masks which are aligned to each other with an accuracy of about ±1 to 2 μm.

3. Process according to claim 1 wherein the thickness of each photoresist layer is about 2 to 10 μm.

4. Process according to claim 1, characterized in that the substrate has a thickness of about 0.1 to 2 mm.

5. Process according to claim 4 characterized in that the substrate has a thickness of about 0.5 to 1 mm.

6. Process according to claim 4, further comprising treating the photoresist layers, after development and exposure, with a cyclic organosilicon compound and postbaking to increase their resistance in oxygen plasma during RIE.

7. Process according to claim 6, further comprising treating the photoresist layers with a solution of hexamethylcyclotrisilazane in xylene for about 90 min. at 40° C. and then postbaking for about 5 min. at 90° C.

8. Process according to claim 6, further comprising, after RIE, stripping the resulting silicon-containing photoresist masks in a stripper bath of about 44 percent KOH, while remaining in the bath for about 60 minutes at a bath temperature of about 70° C.

9. Process according to claim 1 characterized in further comprising treating the surfaces of the substrate materials (1) with about 40 percent by volume sulphuric acid to improve the adhesion of the photoresist.

10. Process according to claim 1, characterized in that a phenolformaldehyde resin with a 3,4-dihydroxybenzophenone-4-[naphthoquinone(1,2)diazide(2)]-sulfonate as reactive constituent is applied as a photoresist.

11. Process according to claim 10 wherein the photoresist is postbaked for about 15 minutes at 80° C.

12. Process according to claim 10, further comprising developing the exposed photoresist layers in a 1:4 DI water diluted sodium borate and sodium hydroxide based developer and subsequently blanket irradiating with UV-light in a wavelength range of 200 to 450 nm.

13. Process according to claim 4, characterized in that a naphthoquinone-diazopolysiloxane is used as a photoresist.

14. Process according to claim 13, further comprising developing the exposed photoresist layers with 10 percent aqueous KOH or a 10 percent solution of tetramethylammoniumhydroxide in alcohol.

15. Process according to claim 13, further comprising postbaking the exposed photoresist layers for about 2 minutes at 80° C., subsequently removing the non-exposed regions of the photoresist layers with an organic solvent.

16. Process according to claim 13, further comprising after RIE, stripping the silicon-containing photoresist masks in a stripper bath of about 44 percent KOH, while remaining in the bath for about 60 minutes at a bath temperature of about 70° C.

17. Process according to claim 1, characterized in that imagewise exposure of the photoresist layers (2) with UV radiation is effected in a wavelength range of 200 to 450 nm.

18. Process according to claim 1, wherein the predetermined etch depth is about ⅔ of the substrate thickness.

19. Process according to claim 1, wherein multilayer ceramic chip carrier, circuit board or guide plate for fine metal wires used to build electrical test heads is produced.

* * * * *